(12) United States Patent
Pal et al.

(10) Patent No.: US 6,202,739 B1
(45) Date of Patent: Mar. 20, 2001

(54) APPARATUS INCLUDING A HEAT-DISSIPATING APPARATUS, AND METHOD FOR FORMING SAME

(75) Inventors: Debabrata Pal, Schaumburg; Kevin McDunn, Lake in the Hills, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/200,410

(22) Filed: Nov. 25, 1998

(51) Int. Cl.[7] .............................. F28D 15/00; F28D 17/00
(52) U.S. Cl. ........................................ 165/104.33; 165/10
(58) Field of Search .......................... 165/10, 104.21, 165/104.33, 185; 361/700, 687

(56) References Cited

U.S. PATENT DOCUMENTS

| | | | |
|---|---|---|---|
| 2,725,505 | * 11/1955 | Webster, Jr. et al. | 165/185 |
| 2,903,629 | * 9/1959 | Walker | 165/185 |
| 3,678,995 | * 7/1972 | Collard | 165/185 |
| 3,780,356 | * 12/1973 | Laing | 165/185 |
| 4,513,053 | * 4/1985 | Chen et al. | 165/104.17 |
| 4,572,864 | * 2/1986 | Benson et al. | 428/305.5 |
| 4,579,170 | * 4/1986 | Moses et al. | 165/104.17 |
| 4,621,032 | * 11/1986 | DeNeufville et al. | 428/688 |
| 4,744,486 | * 5/1988 | Godinho | 220/319 |
| 5,007,478 | * 4/1991 | Sengupta | 165/10 |
| 5,424,913 | * 6/1995 | Swindler | 361/687 |
| 5,508,884 | * 4/1996 | Brunet et al. | 165/104.33 |
| 5,685,363 | * 11/1997 | Orihira et al. | 165/46 |
| 5,725,122 | * 3/1998 | Murphy et al. | 220/521 |

\* cited by examiner

*Primary Examiner*—Ira S. Lazarus
*Assistant Examiner*—Tho Duong
(74) *Attorney, Agent, or Firm*—John B. MacIntyre; Douglas D. Fekete; Lalita P. Williams

(57) ABSTRACT

The present invention provides an apparatus (200) that includes a heat-generating component (202) and a heat-dissipating apparatus (120). The heat-generating component (202) is mounted on a substrate (204). The heat-dissipating apparatus (120) includes a housing piece (100) that includes a sealed chamber (102) and a phase change material (106) disposed within the sealed chamber (102). The heat-dissipating apparatus (120) is thermally coupled to the heat-generating component (202) and provides for heat dissipation by an endothermic process of changing phase from solid to liquid, thereby lowering the operating temperature of the heat-generating component (202).

2 Claims, 2 Drawing Sheets

APPARATUS INCLUDING A HEAT-DISSIPATING APPARATUS, AND METHOD FOR FORMING SAME

FIELD OF THE INVENTION

The present invention relates generally to an apparatus that includes a heat-generating component, and more particularly to an apparatus that includes a heat-dissipating apparatus.

BACKGROUND OF THE INVENTION

Electronic components, such as exciters, power amplifiers, transistors, and others, generate heat as they perform their normal functions. Although these components are able to continue working effectively while experiencing some increase in their temperature, they cannot be allowed to have their temperature raised above a certain temperature, as this can lead to failure in the component or can severely lessen the life of the electronic component.

Electronic devices that include such components typically include means for removing some of the heat from the heat-generating components. Such methods currently include heat sinks, fans, and liquid cooling. Although each of these techniques is effective in lowering the temperature of the components, they are not easily integrated into hand-held electronic equipment, mainly due to the size of these components.

In addition, when dealing with hand-held electronic devices, not only do you have to worry about the life of the component and its failure, but you also need to provide a comfortable operating temperature for the user of the electronic device. For instance, if a heat-generating component is included in a cellular telephone, and the excess heat buildup is not removed, the heat generated by the heat-generating component can be transferred to a user of the device, leading to discomfort for the user.

Consequently, a need exists for a heat-dissipating device that can effectively remove heat from a heat-generating device, and particularly in a handheld electronic device.

DETAILED DESCRIPTION OF A PREFERRED EMBODIMENT

The present invention provides a heat-dissipating apparatus that is effective in removing heat from a heat-generating component. An apparatus, such as a cellular telephone, includes a heat-generating component mounted on a substrate. The apparatus also includes a heat-dissipating apparatus that is thermally coupled to the heat-generating component. The heat-dissipating apparatus includes a housing piece that includes a sealed chamber and a phase change material disposed within the sealed chamber. The phase change material is effective in absorbing heat generated by the heat-generating component, whereby the phase change material changes phase from a solid phase to a liquid phase. This process is endothermic. Consequently, the liquefaction of the phase change material is effective to remove heat from the heat-generating component and to lower the temperature of the heat-generating component.

Figure 1A:
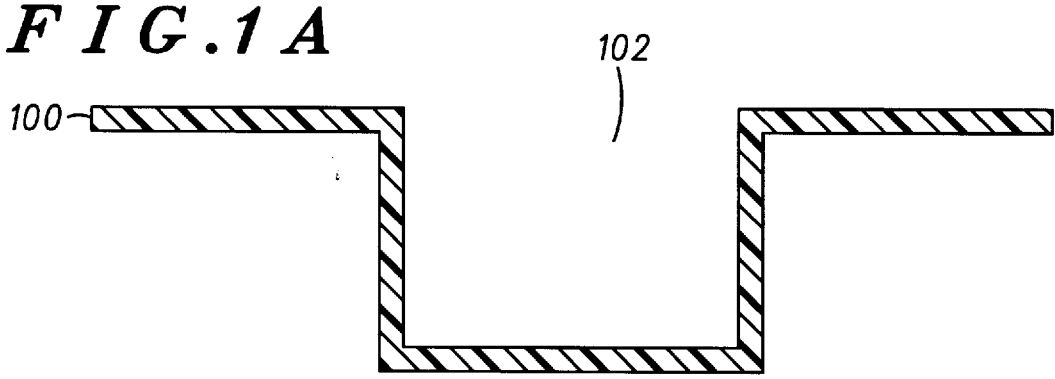
FIG. 1A depicts a cross-sectional view of a housing piece used in a heat-dissipating apparatus in accordance with the preferred embodiment of the present invention.
Figure 1B:
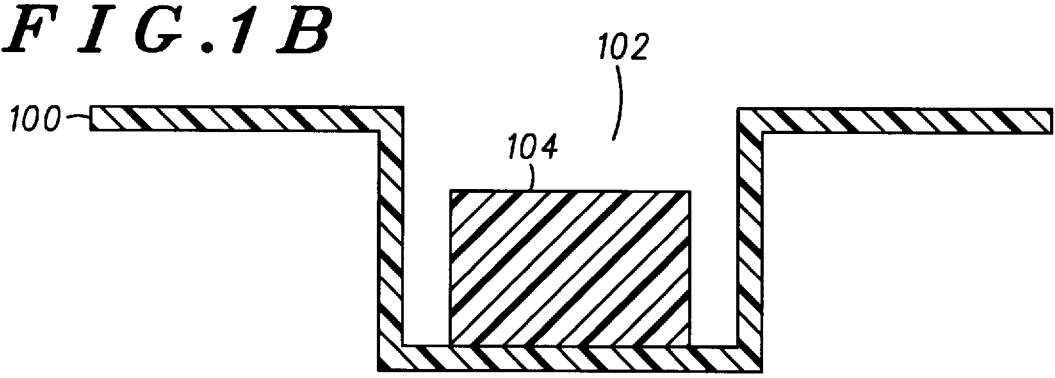
FIG. 1B depicts the housing piece with a heat transfer enhancement agent disposed within a cavity formed in the housing unit in accordance with an alternate embodiment of the present invention.
Figure 1C:
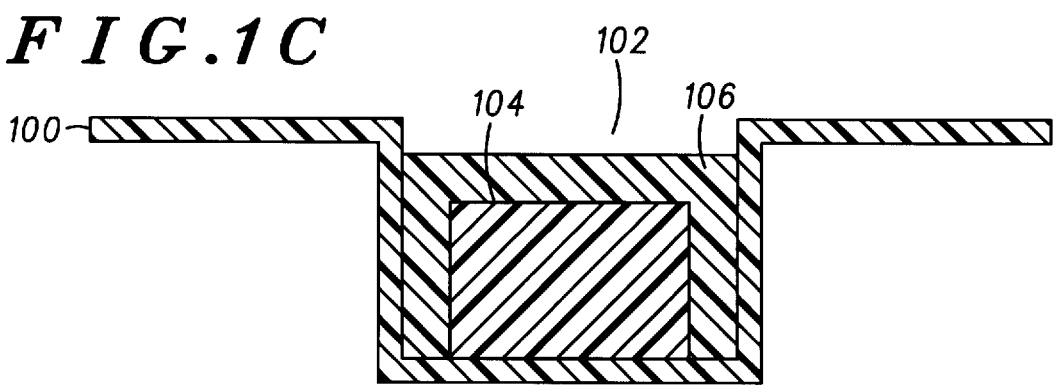
FIG. 1C depicts a housing unit with a phase change material dispensed in the cavity in accordance with the preferred embodiment of the present invention.
Figure 1D:
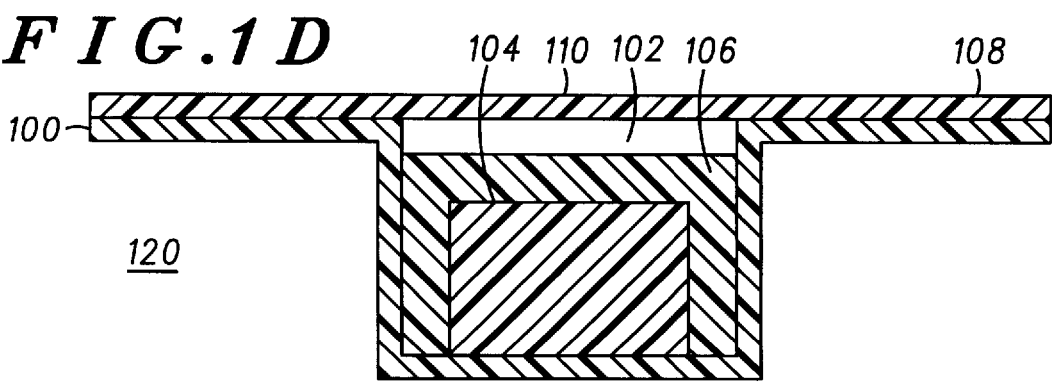
FIG. 1D depicts a heat-dissipating device formed by sealing the cavity and the phase change material with a lid piece in accordance with the preferred embodiment of the present invention.
Figure 3:
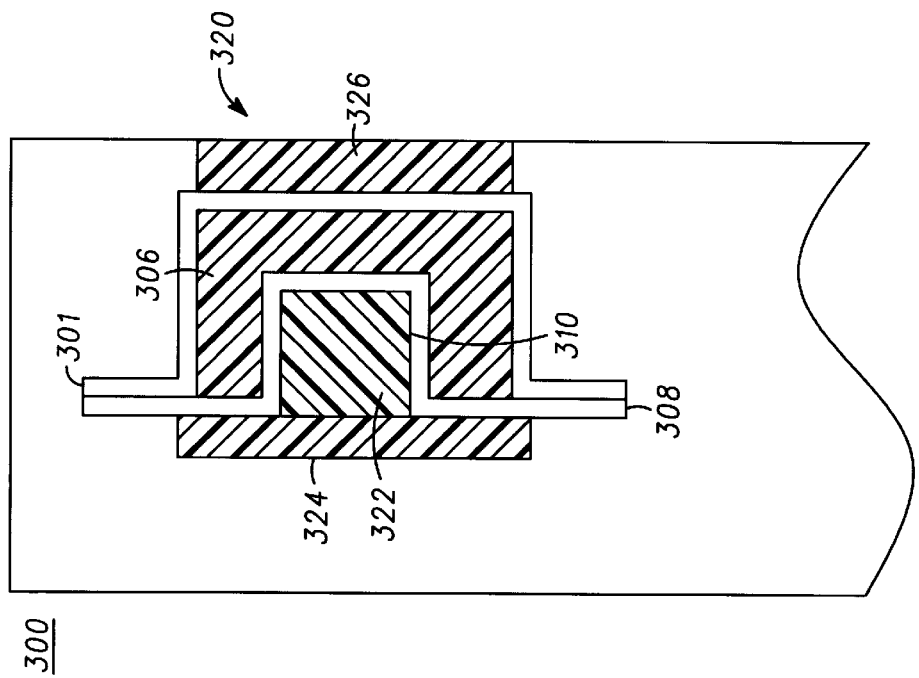
FIG. 3 depicts a cross-sectional view of an apparatus including a heat-dissipating apparatus in accordance with the alternate embodiment of the present invention.
Figure 2:
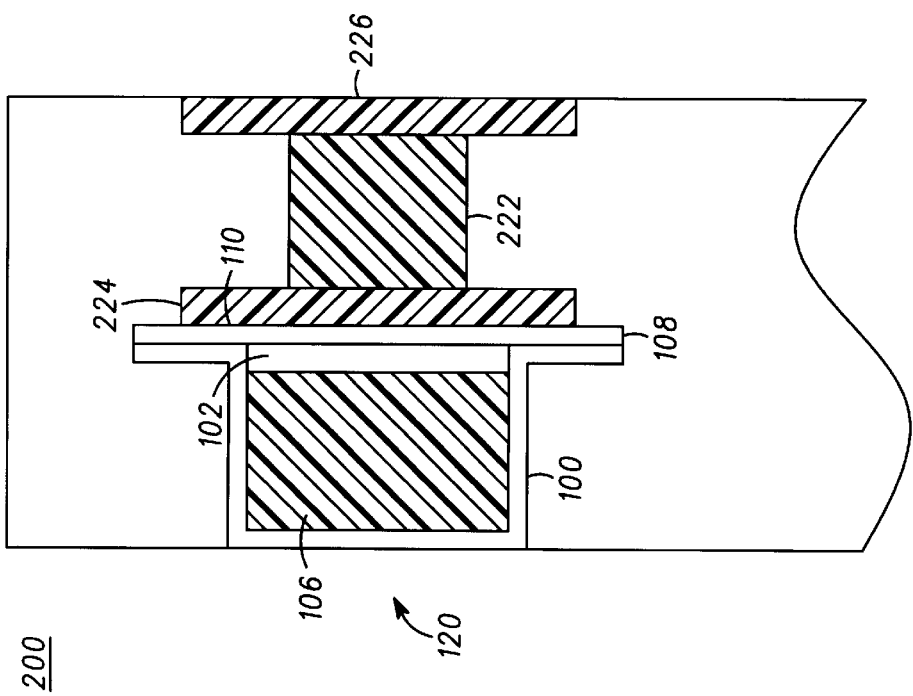
FIG. 2 depicts a cross-sectional view of an apparatus including a heat-dissipating apparatus in accordance with the preferred embodiment of the present invention.

The present invention can be better understood with reference to FIGS. 1–3. FIGS. 1A–1D depict a cross-sectional view of a method for forming a heat-dissipating apparatus in accordance with the present invention. FIG. 1A depicts a housing piece 100. Housing piece 100 is preferably formed of a thin sheet of metal, preferably aluminum. Cavity 102 is formed in housing piece 100, preferably by stamping. Cavity 102 is preferably formed in a generally cylindrical shape, but can alternately be formed in a rectangular shape or any shape that is effective in dissipating heat.

FIG. 1B depicts an alternate embodiment of the present invention. In the alternate embodiment of the present invention, a heat transfer enhancement agent 104 is disposed within cavity 102 of housing piece 100. Heat transfer enhancement agent 104 is effective in spreading heat within cavity 102 to provide for more uniform distribution of heat incident upon housing 100. Heat transfer enhancement agent 104 is preferably formed of a porous aluminum foam, but any material that is capable of spreading heat throughout cavity 102 would be effective as well.

FIG. 1C depicts a phase change material 106 dispensed into cavity 102. In the preferred embodiment of the present invention, phase change material 106 is dispensed into an empty cavity 102. In the alternate embodiment, as depicted in FIG. 1C, phase change material 106 is dispensed into cavity 102 with a heat transfer enhancement agent 104 disposed therein. Cavity 102 has a volume. A predetermined volume of phase change material 106 is dispensed into cavity 102. In the preferred embodiment of the present invention, the predetermined volume of phase change material 106 dispensed is less than the volume of cavity 102. In this manner, cavity 102 is not completely filled with phase change material 106. It is important to not completely fill cavity 102 with phase change material 106, because most phase change materials expand when changing from a solid phase to a liquid phase. Paraffin waxes expand in volume by about 10% when melting, while metals typically expand by about 2.5% upon melting. By leaving volume unfilled in cavity 102, room is left for expansion of phase change material 106.

Phase change material 106 comprises a material that changes phase, from solid to liquid, upon heat being applied. In the preferred embodiment, phase change material 106 is formed of a material that is solid at room temperature.

In the preferred embodiment, phase change material 106 is formed of an organic paraffin compound. Some examples of an organic paraffin compound include n-eicosene, n-octadecane, and n-dotriacontane. In an alternate embodiment of the present invention, phase change material 106 is formed of a low-temperature solder alloy, such as the eutectic bismuth-lead-tin-indium alloy. In a further alternate embodiment, phase change material 106 is formed of a low-temperature metal, such as gallium. Each of the metallic phase change materials will greatly increase the thermal conductivity of phase change material 106, and consequently will preferably not need a heat transfer enhancement agent 104 as depicted in FIG. 2.

FIG. 1D depicts a lid piece 108 disposed onto housing piece 100. Lid piece 108 is preferably formed of a thin sheet of metal, preferably aluminum. Lid piece 108 is preferably planar and is placed onto housing piece 100 such that lid piece 108 completely overlies and covers cavity 102.

Lid piece 108 is then attached to housing piece 100 to form heat-dissipating apparatus 120. In the preferred embodiment, lid piece 108 is sealed to housing piece 100 via a low-temperature process, preferably conducted at a temperature below the melting temperature of phase change 106. In this manner, phase change material 106 will not melt during attachment of lid piece 108 to housing piece 100, thereby ensuring that phase change material 106 will remain within cavity 102 during attachment. It should be understood that the temperature at which lid piece 108 is attached to housing piece 100 can be accomplished at a temperature slightly higher than the melting temperature of phase change material 106, as long as the temperature at phase change material 106 does not exceed its melting temperature. In the preferred embodiment of the present invention, lid piece 108 is attached to housing piece 100 via a crimping process. In an alternate embodiment of the present invention, lid piece 108 is attached to housing piece 100 via an ultrasonic welding process or via an adhesive bonding process, with an adhesive such as an epoxy resin. Regardless of the method for attaching lid piece 108 to housing piece 100, it is critical that lid piece 108 be attached to housing piece 100 such that a seal is formed therebetween. This is important because the seal provides for the containment of phase change material 106 when phase change material 106 changes into liquid form upon heating.

Heat-dissipating apparatus 120 includes a heat-transfer surface 110. Heat-transfer surface 110 is effective to transfer heat from a heat-generating component to phase change material 106. In the preferred embodiment of the present invention, heat-transfer surface 110 is planar and opposite cavity 102. In an alternate embodiment of the present invention, heat-transfer surface 110 is shaped in such a way as to conform to a heat-generating component, as depicted below in FIG. 3.

FIG. 2 depicts an apparatus 200. In the preferred embodiment of the present invention, apparatus 200 comprises a wireless communication device, such as a cellular telephone or a two-way radio. Apparatus 200 can alternately comprise an apparatus that includes a heat-generating component where it is desired to remove some of the heat from the heat-generating component. Apparatus 200 includes a heat-generating component 222 that is mounted on a substrate 224. Heat-generating component 222 is preferably an exciter, but can alternately be a high-power RF transistor, a DC/DC converter, an AC/DC converter, a Digital Signal Processor, or any other electronic component that generates heat during operation. Substrate 224 is preferably formed of a glass-epoxy laminate commonly referred to as FR-4, but can alternately be formed of ceramic or other suitable substrate materials. In the preferred embodiment, apparatus 200 also includes an ear piece 226.

In current hand-held communication devices, the optimal placement for exciter 222 is toward the top portion of apparatus 200. By placing heat-generating device 222 near the top portion of apparatus 200, heat-generating component 222 is closer to the antenna of apparatus 200, which is typically located at the top of apparatus 200. However, one downside of this arrangement is that heat-generating component 222 is located directly behind ear piece 226. For short calls, this arrangement is not disadvantageous. However, during long calls, as exciter 222 heats up during normal use, the temperature of ear piece 226 begins to rise. After a period of time, this increase in temperature of ear piece 226 can lead to discomfort by the user of apparatus 200.

In the preferred embodiment of the present invention, heat-dissipating apparatus 120 is thermally coupled to heat-generating component 222. As depicted in FIG. 2, heat generated by heat-generating component 222 is transferred through substrate 224 to heat-dissipating apparatus 120.

The following process would happen during a call utilizing the present invention. As the call begins, and heat-generating apparatus 222 begins to function normally, heat-generating apparatus 222 begins to heat up. After a few minutes of heating up, as the temperature of heat-generating apparatus 222 continues to increase, the heat generated by apparatus 222 is transferred to heat-dissipating apparatus 120 through substrate 224. Phase change material 106 located within cavity 102 of heat-dissipating apparatus 120 begins to change phase from a solid phase to a liquid phase. During the time while phase change material 106 is melting (changing phase from solid to liquid), a constant operating temperature is ensured, since phase change material 106 melts isothermally. This isothermal reaction allows for even absorption of heat from heat-generating component 222. This even absorption of heat by phase change material 106 will continue until phase change material 106 is completely in a liquid state.

After the call, when heat-generating component 222 is no longer generating heat, phase change material 106 will re-solidify by radiating heat to the surrounding atmosphere. In this manner, phase change material 106 will re-solidify to be ready to absorb more heat during the next call, or when heat-generating component 222 starts generating heat again.

FIG. 3 depicts an apparatus 300 in accordance with an alternate embodiment the present invention. Apparatus 400 includes a heat-generating component 322 attached to a substrate 324. Apparatus 400 also includes a heat-dissipating apparatus 320. Heat-dissipating apparatus 320 comprises a housing piece 301 that includes a cavity 302 formed therein. The cavity is filled with a liquid phase change material 306, and prior to phase change material 306 changing to a solid phase, a lid piece 308 is placed into phase change material 306 within cavity 302. The lid piece 308 has an impression that is of the same size and shape as heat-generating component 322. The impression within lid piece 308 is preferably formed prior to attachment. Alternately, lid piece 308 is formed of a conformable material, such as a very thin aluminum sheet, and the impression is formed by pressing heat-generating component 322 into the conformable lid piece. Phase change material 306 is then allowed to solidify.

Housing piece 300 can alternately be formed in a shape such that the cavity extends through housing piece 300. This generally donut shape allows for phase change material to be disposed within the cavity, and the cavity to surround the heat-generating component, but the heat-dissipating apparatus will not make the apparatus any thicker, since it does not add any depth to the apparatus.

Lid piece 308 is then attached to housing piece 300 to seal cavity 302. As stated with regard to the preferred embodiment, the attachment process is done such that the temperature within cavity 302 does not exceed the melting temperature of phase change material 306 within cavity 302. This is preferably done by crimping, but can also be done by ultrasonic welding, adhesive bonding, or other suitable processes.

Heat-generating component 322, which is attached to substrate 324, is then coupled to heat-dissipating apparatus 320 such that heat-generating component 322 fits into the depression formed in lid piece 308. Upon heating during normal operation, the heat generated by component 322 is transferred through heat-transfer surface 310 of lid piece 308 to phase change material 306. Phase change material 306 will, upon sufficient heat, begin to liquefy, which will remove heat from component 322.

One advantage to the alternate embodiment is that there is a buffer layer between heat-generating component 322 and ear piece 326. This provides for additional comfort for the user of apparatus 300.

The present invention provides an apparatus that includes a heat-dissipating apparatus. The heat-dissipating apparatus removes heat from a heat-generating component, thereby prolonging the life of the heat-generating component and lowering the operating temperature of the apparatus. This provides for increased comfort to the user of the apparatus. By providing the phase change material in a sealed cavity, the phase change material is allowed to liquefy and solidify with damaging component of the apparatus when in a liquid state.

While this invention has been described in terms of certain examples thereof, it is not intended that it be limited to the above description, but rather only to the extent set forth in the claims that follow.

We claim:

1. A method for forming a heat-dissipating apparatus, the method comprising the steps of:

providing a housing piece with a cavity therein;

dispensing a phase change material into the cavity;

placing a lid piece on the housing piece, the lid piece formed of a conformable material and enclosing the phase change material within the cavity;

sealing the cavity by attaching the lid piece to the housing piece; and impressing a heat-generating electronic component in a recess of the lid piece such that the heat-generating electronic component is at least partial surrounded by the phase change material and is thermally-coupled to the phase change material by the lid piece.

2. A method for forming a heat-dissipating apparatus in accordance with claim 1, wherein the phase change material is in a liquid phase when the lid piece is impressed by the heat-generating electronic component and solidifies thereafter.

* * * * *

UNITED STATES PATENT AND TRADEMARK OFFICE
CERTIFICATE OF CORRECTION

| | |
|---|---|
| PATENT NO. | : 6,202,739 B1 |
| DATED | : March 20, 2001 |
| INVENTOR(S) | : Pal et al. |

It is certified that error appears in the above-identified patent and that said Letters Patent is hereby corrected as shown below:

<u>Column 6,</u>
Line 20, reads "partial"; should read -- partially --

Signed and Sealed this

Sixth Day of November, 2001

Attest:

NICHOLAS P. GODICI
*Attesting Officer*   *Acting Director of the United States Patent and Trademark Office*